(12) United States Patent
Lapinski et al.

(10) Patent No.: US 7,398,168 B2
(45) Date of Patent: Jul. 8, 2008

(54) METHOD AND SYSTEM FOR MONITORING POWER FLOW THROUGH AN ELECTRIC POWER TRANSMISSION LINE

(75) Inventors: Sterling Lapinski, Louisville, KY (US); Deirdre Alphenaar, Louisville, KY (US); Stephen Deese, Louisville, KY (US)

(73) Assignee: Genscape Intangible Holding, Inc., Louisville, KY (US)

( * ) Notice: Subject to any disclaimer, the term of this patent is extended or adjusted under 35 U.S.C. 154(b) by 311 days.

(21) Appl. No.: 11/221,959

(22) Filed: Sep. 8, 2005

(65) Prior Publication Data

US 2007/0052493 A1    Mar. 8, 2007

(51) Int. Cl.
   *G01R 21/00* (2006.01)
(52) U.S. Cl. ............................ 702/60; 702/65; 324/74; 324/260
(58) Field of Classification Search ................. 702/57, 702/60–62, 64, 65; 324/74, 107, 117 R, 324/126, 260, 330, 345, 557, 750; 340/870.07, 340/870.16, 870.25; 361/42, 47, 65; 700/286, 700/291–294, 297, 298
   See application file for complete search history.

(56) References Cited

U.S. PATENT DOCUMENTS

| | | | |
|---|---|---|---|
| 4,539,520 A | * | 9/1985 | McBride .................. 324/117 H |
| 5,181,026 A | | 1/1993 | Granville |
| 5,202,812 A | | 4/1993 | Shinoda et al. |
| 5,757,283 A | | 5/1998 | Janoska |
| 6,229,313 B1 | | 5/2001 | Seigel |
| 6,625,554 B2 | | 9/2003 | Suga et al. |
| 6,654,216 B2 | | 11/2003 | Horvath et al. |
| 6,671,635 B1 | | 12/2003 | Forth et al. |

(Continued)

FOREIGN PATENT DOCUMENTS

WO        00/77535        12/2000

(Continued)

OTHER PUBLICATIONS

Deno et al., Field Effects of Overhead Transmission Lines and Stations, Transmission Line Reference Book—345kV and Above, 1987, pp. 329-380, Second Edition—Revised, Electric Power Rersearch Institute, Inc.

(Continued)

*Primary Examiner*—Manuel L Barbee
(74) *Attorney, Agent, or Firm*—Stites & Harbison, PLLC; David W. Nagle, Jr.; Jeffrey A. Haeberlin

(57) ABSTRACT

A conductor configuration and a power flow of an electric power transmission line set is determined at a location along the line set, and positions in a substantially planar area that is transverse to the line set are determined where a predetermined change in the power flow results in a maximum change in the magnetic field at the positions. A system for monitoring power flow includes a plurality of magnetic field monitors placed at the selected positions, and a central processing facility for communicating the power flow to an end user. A method for monitoring power flow includes selecting positions for placement of a plurality of magnetic field monitors, placing the monitors, determining a power flow, and communicating the power flow to an end user.

14 Claims, 13 Drawing Sheets

U.S. PATENT DOCUMENTS

| | | |
|---|---|---|
| 6,714,000 B2 | 3/2004 | Staats |
| 6,771,058 B2 * | 8/2004 | Lapinksi et al. ........ 324/117 R |
| 2004/0183522 A1 | 9/2004 | Gunn et al. |
| 2005/0040809 A1 | 2/2005 | Uber, III et al. |
| 2005/0286190 A1 | 12/2005 | Rostron et al. |

FOREIGN PATENT DOCUMENTS

| | | |
|---|---|---|
| WO | 2006/007131 | 1/2006 |

OTHER PUBLICATIONS

Shoureshi et al., "Electro-magnetic-acoustic transducers for automatic monitoring and health assessment of transmission lines" (Abstract), Journal of Dynamic Systems, Measurement and Control, Transactions of the ASME, Jun. 2004, pp. 303-308, vol. 126 No. 2.

Wong et al., "Long term magnetic field monitoring near power lines" (Abstract), IEEE Transactions on Power Delivery, Apr. 1997, pp. 922-927, vol. 12 issue 2, Vancouver, B.C.

Salceanu et al., "The survey of the electromagnetic environment in a residential area traversed by transmission lines" (Abstract), 12th IMEKO International Symposium on Electical Measurements and Instrumentation proceedings, Sep. 2002, pp. 227-230, Zabreb, Croatia.

ISA/US, International Search Report and Written Opinion of the International Searching Authority, Mar. 8, 2006, pp. 1-5.

* cited by examiner

METHOD AND SYSTEM FOR MONITORING POWER FLOW THROUGH AN ELECTRIC POWER TRANSMISSION LINE

CROSS-REFERENCE TO RELATED APPLICATIONS

None.

BACKGROUND OF THE INVENTION

A. Field of the Invention

This invention relates to monitoring the power flowing through electric power transmission lines. More particularly, the invention relates to a method and system for selecting positions for a preferred placement of a plurality of magnetic field monitors where a change in the power flowing through the transmission line will result in a maximum change in the magnetic field at the positions.

B. Description of Related Art

Information about the power flowing through electric power transmission lines and electric power generation facility output is useful and valuable for companies engaged in the business of buying and selling electric power on the open market. Electric power producers do not currently release this information to other participants in the market.

A typical overhead transmission line consists of three conductor bundles, separated from each other in a spatial configuration and running between transmission line towers. Each conductor bundle carries a different phase of the power transmitted through the line, and the total power flowing through the transmission line is the summation of the power flowing through each of the three conductor bundles. Conductor bundles typically consist of 2 to 4 conductors in a bundle. For convenience, conductor bundles will be referred to hereinafter as "conductors," which shall be understood to refer to the medium of a transmission line that carries the phases of the power flowing through the transmission line. The conductors making up each transmission line carry alternating current (AC) at a specific frequency (60 Hz in the United States, 50 Hz in Europe). The currents flowing in a transmission line generate magnetic fields and the high voltages (typically ranging from 12 kV to 1,000 kV) generate electric fields. The net electric and magnetic fields that surround a transmission line are a superposition of the fields created by the currents and voltages associated with each individual conductor. Both the electric and magnetic fields are largest close to the conductors and fall off rapidly with distance from the conductors.

Often, the transmission line towers will carry several transmission lines, which will be referred to herein as a "line set" or a "transmission line set". For convenience, the terms "line set" and "transmission line set" will be understood to also include configurations where only a single transmission line is present. The net electric and magnetic fields that surround the transmission line set are a superposition of the fields created by the individual conductors of each transmission line. Each transmission line may carry a power flow that differs in magnitude and direction from any other transmission line in the transmission line set. For example, a transmission line set may have a first transmission line carrying 100 megawatts (MW) in one direction, and a second transmission line carrying 300 MW in the opposite direction.

The "conductor configuration" is the actual, geometric arrangement of the conductors in the transmission line set. Several exemplary configurations are shown in FIG. 1a-FIG. 1f, including: vertical parallel (FIG. 1a); horizontal parallel (FIG. 1b); triangular parallel (FIG. 1c); vertical single (FIG. 1d); horizontal single (FIG. 1e); and triangular single (FIG. 1f). The general spatial configuration of the transmission line set (e.g. vertical parallel, horizontal parallel, triangular parallel, etc.) will most likely be consistent along large spans of the transmission line set. However, the actual geometric arrangement of the lines will vary from transverse area to transverse area along the line as a result of variations in the tension and sag in the individual conductors. Additionally, individual conductor sag will also affect the distances of the individual lines from the ground continuously along the transmission line set.

Transmission line sets are designed to operate at fixed voltage values and a maximum power/current capacity. These values can be obtained from available power line mapping resources (such as Platts Power Map, of Platts, Colo.).

The relationships between the currents and voltages associated with the transmission line set and the resulting electric and magnetic fields are characterized by well-known mathematical models (primarily Maxwell's Law and the Biot-Savart Law). Thus, the electric and magnetic fields contain the information necessary to determine the currents and voltages (i.e. power) that produced them. U.S. Pat. No. 6,771,058, incorporated herein by reference, describes an apparatus and method for the measurement and monitoring of electrical power flowing over a high-voltage electric power transmission line set, including a method of determining the power flowing through a transmission line set from measured electric and magnetic field data.

The amount of power flowing through a transmission line set is determined by the current times the voltage as shown in equation (1).

$$\text{Power(MW)} = V_L \sum_i I_i \cos\phi \quad (1)$$

where $V_L$ is the line voltage, $$\sum_i I_i$$

is the summation of the currents through each conductor, and $\phi$ is the difference between the phase of the line voltage and phase of the line current. Because the voltage of a transmission line set is fixed, the amount of power flowing through that line at any particular time can be measured by determining the current through the line. The current produces the aforementioned magnetic field, the measured magnitude of which, when analyzed in light of the conductor configuration and the distance of the measuring point from each of the conductors, determines the amount of power through the line.

The magnetic field associated with an overhead transmission line set is generally considered in terms of the magnetic flux density vector, B, in Tesla surrounding the lines, which is directly proportional to the conductor currents $I_i$ as shown in equation (2) and inversely proportional to the distance $r_i$ from the center of the each conductor to the point of measurement.

$$B \propto \sum_i \frac{I_i}{r_i} \qquad (2)$$

The magnetic flux density vector, B, lies along the XY plane perpendicular or transverse to the length axis (Z) of the conductors and points according to the "right-hand-rule" either clockwise or anti-clockwise dependent on the direction of current flow. This vector can be resolved into horizontal and vertical components $B_x$ and $B_y$, respectively. As used herein, the term "magnetic field" refers to the magnetic flux density vector, including but not limited to the magnitude and orientation of the magnetic field and its components.

The phase relationship between the current and voltage on the line determines the power factor (or more generally, the direction of power flow). This phase relationship is translated to the phases of the resulting magnetic and electric fields, so the phase relationship of these fields at any measuring point can be used to determine the direction of flow, once similarly adjusted for the line geometry and other factors. Thus, it is possible to determine the amount and direction of power flowing through a transmission line set (the "power flow" of the transmission line set) by measuring the electric and magnetic fields associated with the line set and processing the information appropriately. (See: U.S. Pat. No. 6,771,058.)

In practice, errors in power determination arise due to imperfections in the measurement equipment and inaccuracy of various assumptions used in the mathematical models described in equations (1) and (2). The first group includes imperfect sensor alignment and orientation with respect to the magnetic and electric fields. An additional source of error involves less than perfect sensor calibration. Calibration errors stem from the assumptions made in the mathematical model. The distances between the conductors and the sensing equipment are assumed to be fixed. However, the amount of sag on the lines as a result of temperature induced linear expansion means these distances are variable. In applying equation (2) the measured magnetic field is modeled to be a result of equal current flowing in each conductor bundle associated with the line. In reality, small current imbalances exist between the conductor bundles. These imbalances cannot be measured directly, but will lead to distortion in the magnetic field measurements that are difficult to account for in the magnetic field model. In addition, the model does not take into consideration any external currents induced through the ground wire and other related tower structures. These currents will result in distortions in the measured magnetic field and are very difficult to include in the model. The extent of measurement and model inaccuracies vary with the amount and distribution of power flowing through a particular transmission line set and the complexity of the conductor configuration.

Additionally, the resultant fields created by the conductor configuration and power flow of a transmission line set vary when the amount of power flowing through the transmission line set varies. Accurate monitoring of the power flow through the transmission line set requires accurate detection of changes in the resultant fields. For instance, a vertical parallel conductor configuration, such as that shown in FIG. 1a, may produce a horizontal magnetic field sectional view for various power flows as shown in FIG. 2. In certain areas 202, 204 large changes in power flow result in only minimal changes in magnetic field. Combined with the intrinsic measurement errors discussed above, placing magnetic field monitors in these areas will likely result in difficulty in accurately detecting changes in power flow. However, in another area 206 changes in power flow result in large changes in magnetic field, such that intrinsic measurement errors are unlikely to affect accurately detecting changes in power flow. Therefore, it is preferable to place magnetic field sensors at positions where minimal changes in power flow through the line results in a maximum change in the magnetic field.

Thus, there is a need for a method and system for monitoring the power flowing through an electric power transmission line set using magnetic field monitors placed at selected positions where a predetermined change in the power flow of the transmission line set results in a maximum change in the magnetic field at the positions. Additionally, there is a further need for a method for selecting the positions for the preferred placement for such magnetic field monitors.

SUMMARY OF THE INVENTION

The present invention meets these and other needs by providing a method for selecting positions for a preferred placement of a plurality of magnetic field monitors for monitoring the power flowing through an electric power transmission line set, and a method and system for monitoring the power flowing through a line set utilizing such selected positions.

According to one aspect of the invention, a method for selecting positions for a preferred placement for a plurality of magnetic field monitors for monitoring the power flowing through an electric power transmission line set includes: determining a conductor configuration and a power flow of the transmission line set at a location along the transmission line set; and determining positions in a substantially planar area that is transverse to the transmission line set at the location where a predetermined change in the power flow of the line set results in a maximum change in the magnetic field at the positions, thereby indicating the preferred placement of the monitors. Advantageously, the method is performed through computational analyses performed on a digital computer.

More specifically, determining the conductor configuration is accomplished by obtaining the horizontal and vertical distances between each conductor of the transmission line set and a plurality of measuring points across the substantially planar area. The power flow of the transmission line is obtained by obtaining magnetic field values at the measuring points, generating predicted magnetic field values at each measuring point for a range of line set power flows, and selecting the line set power flow where the predicted values have a best fit with the obtained values.

The positions where a change in the power flow of the line set result in a maximum change in magnetic field at the positions are determined by obtaining the predicted magnetic field values at each measuring point for the determined power flow, obtaining predicted magnetic field values at each measuring point for a power flow where the determined power flow has changed by a predetermined amount, determining the differences between the predicted values for the changed power flow and the predicted values for the determined power flow at each measuring point, and selecting the measuring points having the maximum differences as the positions where a change in the power flow results in a maximum change in the magnetic field at the positions.

Alternatively, the positions may be determined by generating magnetic field difference curves for the vector components of the predicted values for the changed power flow and the predicted values for the determined power flow, and selecting the positions corresponding to the maxima of the difference curves for the preferred placement for the monitors.

According to another aspect of the invention, a computer readable medium has computer executable instruction for performing the steps of the method for selecting positions for a preferred placement for a plurality of magnetic field monitors for monitoring the power flowing through an electric power transmission line set, described immediately above.

According to yet another aspect of the invention, a system for monitoring the power flowing through an electric power transmission line set includes a plurality of magnetic field monitors placed at selected positions in a substantially planar area that is transverse to the transmission line set, and a central processing facility in communication with the plurality of magnetic field monitors for communicating the power flow to an end user. The positions for placement of the magnetic field monitors are selected by determining the conductor configuration and the power flow of the transmission line in the substantially planar area, and determining positions in the substantially planar area where a predetermined change in the power flow of the line set results in a maximum change in the magnetic field at the positions, as described above.

Lastly, another aspect of the invention is a method for monitoring the power flowing through an electric power transmission line set including: selecting positions for a preferred placement for a plurality of magnetic field monitors, placing the monitors at the selected positions, performing a computational analysis of the magnetic field data to determine a power flow through the transmission line set, and communicating the power flow to an end user. Advantageously, the selection of the positions for the preferred placement of the magnetic field monitors may utilize aspects of the method described above.

The preceding description is provided as a non-limiting summary of the invention only. A better understanding of the invention will be had by reference to the following detail description, and to the appended drawings and claims.

DETAILED DESCRIPTION OF EXEMPLARY EMBODIMENTS

Figures 1A, 1B:
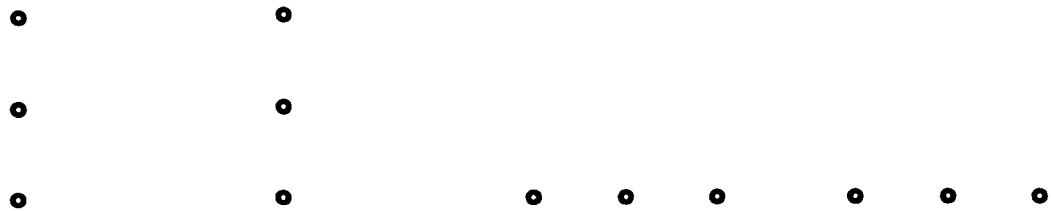
FIGS. 1a-1f are views of exemplary electric power transmission line sets and line sets having various conductor configurations.
Figures 1C, 1D:
Figures 1E, 1F:
Figure 2:
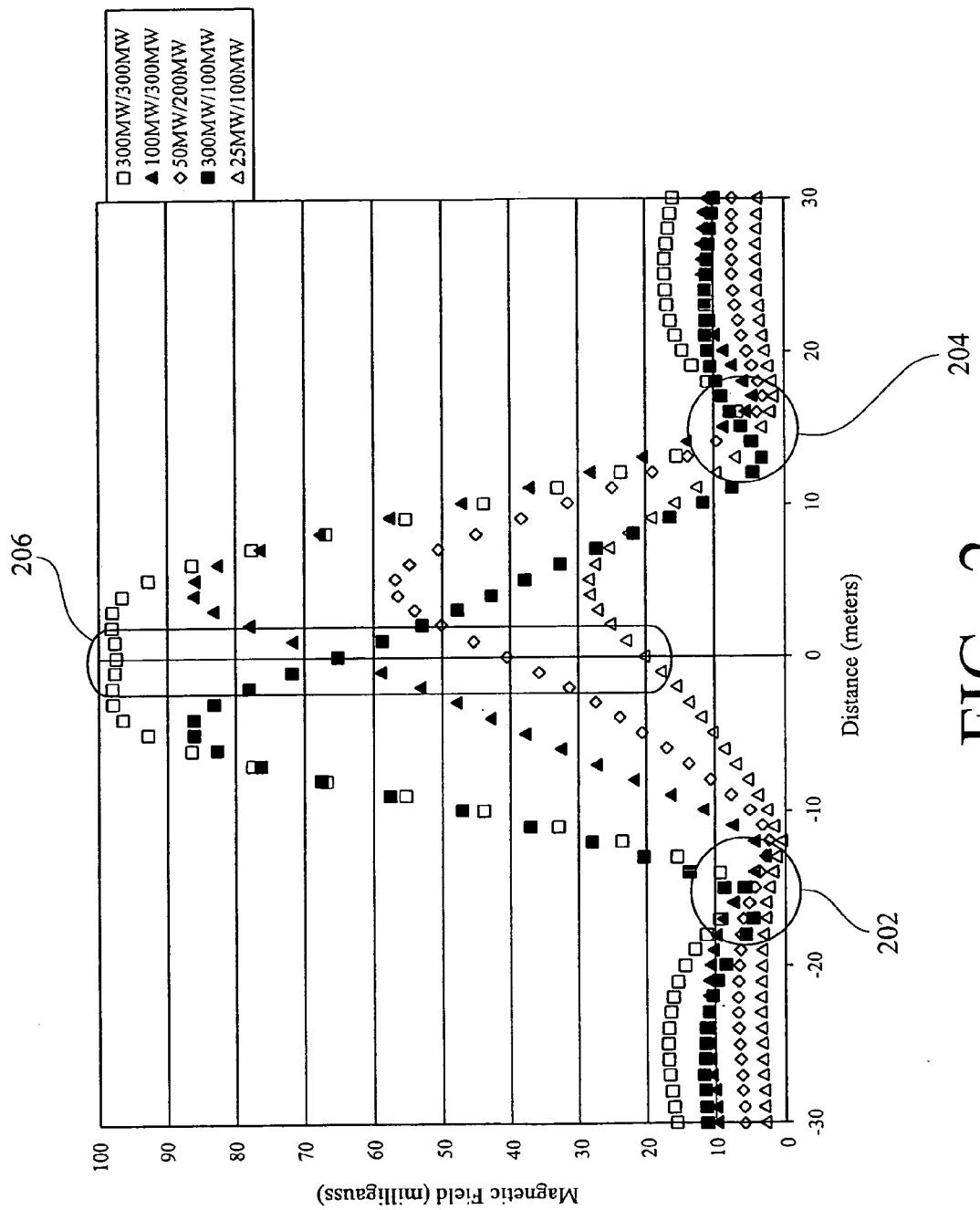
FIG. 2 is a profile of predicted horizontal magnetic field values for a range of line current configurations for a particular planar area transverse to a representative vertical parallel transmission line set.
Figure 3:
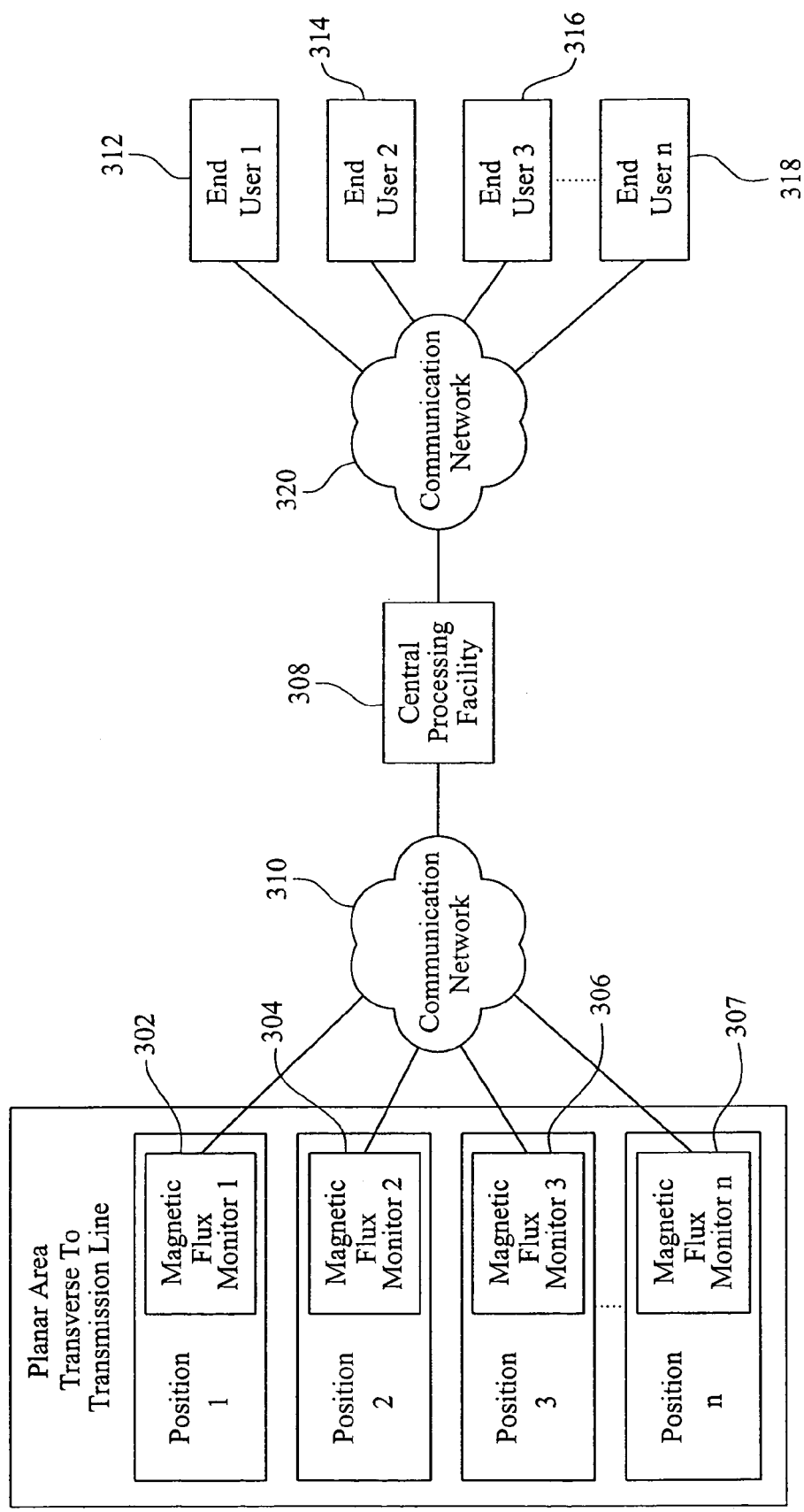
FIG. 3 is a block diagram of an exemplary system for monitoring the power flow through an electric power transmission line set, according to an embodiment of the invention.

As shown in FIG. 3, an exemplary system for monitoring the power flowing through an electric power transmission line set generally comprises a plurality of magnetic field monitors 302, 304, 306, 307 and a central processing facility 308 in communication with the plurality of magnetic field monitors 302, 304, 306, 307 through a communication network 310, such as the Internet or the like. Additionally, one or more end users 312, 314, 316, 318 are in communication with the central processing facility 308 through a communication network 320, such as the Internet or the like. Power flow information is gathered by the magnetic field monitors 302, 304, 306, 307 and transmitted to the end users 312, 314, 316, 318 through the central processing facility 308. The monitors 302, 304, 306, 307 can do all of the processing required to determine the power flow, or they can transmit the magnetic field data to the central processing facility 308 for determination of the power flow.

Figure 4:
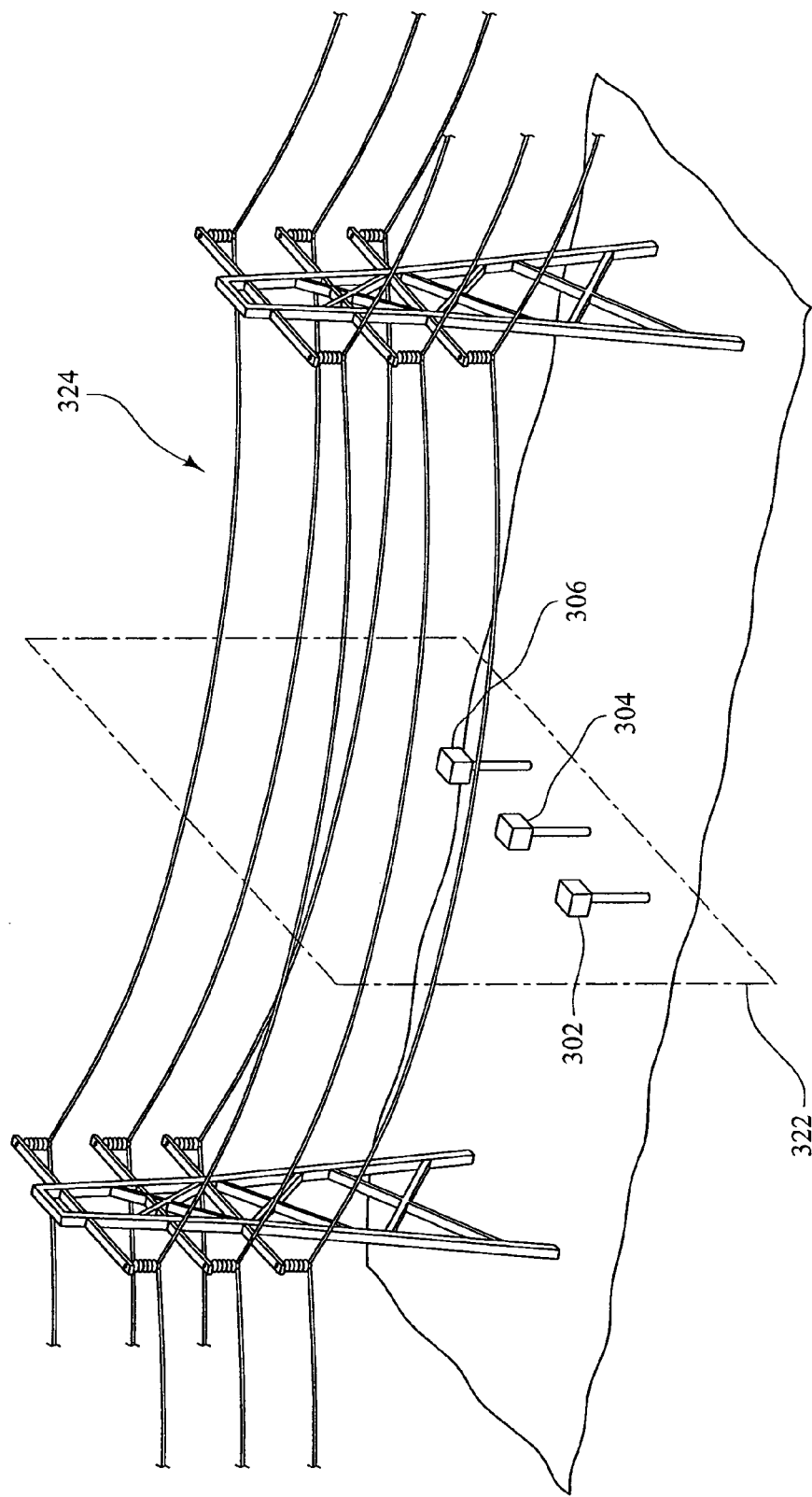
FIG. 4 is a perspective view of an electric power transmission line set, showing a substantially planar area that is transverse to the transmission line set and placement of magnetic field monitors in the substantially planar area.
Figure 5:
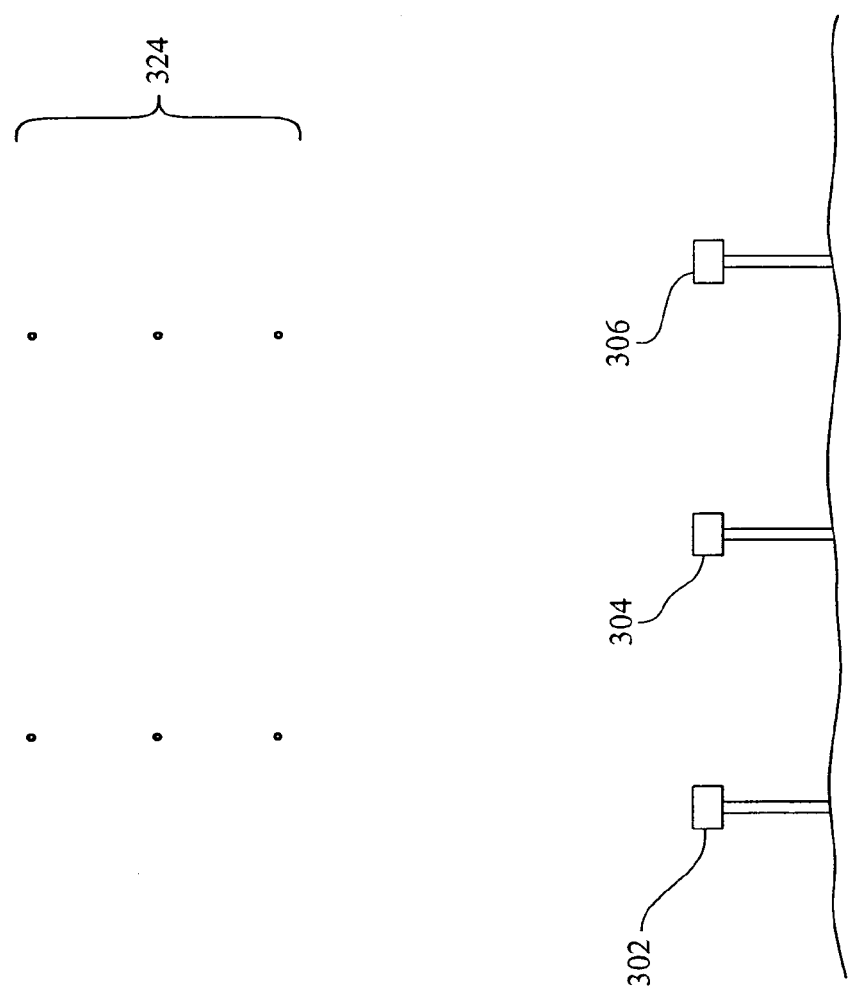
FIG. 5 is a sectional view of the substantially planar area of FIG. 4.

As shown in FIG. 4 and FIG. 5, the magnetic field monitors 302, 304, 306 are placed at selected positions in a substantially planar area that is transverse to the transmission line set 324. The positions are selected so that a predetermined change in the power flow of the line set will result in a maximum change in the magnetic field at the positions. Placement of the monitors 302, 304, 306 in the substantially planar area 322 that is transverse to the transmission line set 324 enables the relationships between the currents and voltages associated with the conductors of the transmission line set and the resulting electric and magnetic fields to be characterized by well known mathematical models using the Biot-Savart law and other numerical analysis techniques.

In an exemplary embodiment, each magnetic field monitor has two magnetometers for sensing the horizontal magnetic field value and the vertical magnetic field value at the monitor. Thus, each of the two magnetometers is placed such that its sensitive axis is aligned in either the horizontal or vertical direction. Further, such monitors may also have an electric field sensor. A detailed description of such monitors or monitoring devices, including the components and component interactions, can be found in U.S. Pat. No. 6,771,058, previously incorporated herein by reference. However, one of skill in the art will understand that the spirit and the scope of the invention is not limited to specifically measuring horizontal and vertical magnetic field values, as other magnetic field vector components may be utilized in equivalent embodiments within the teaching of the invention.

Figure 6:
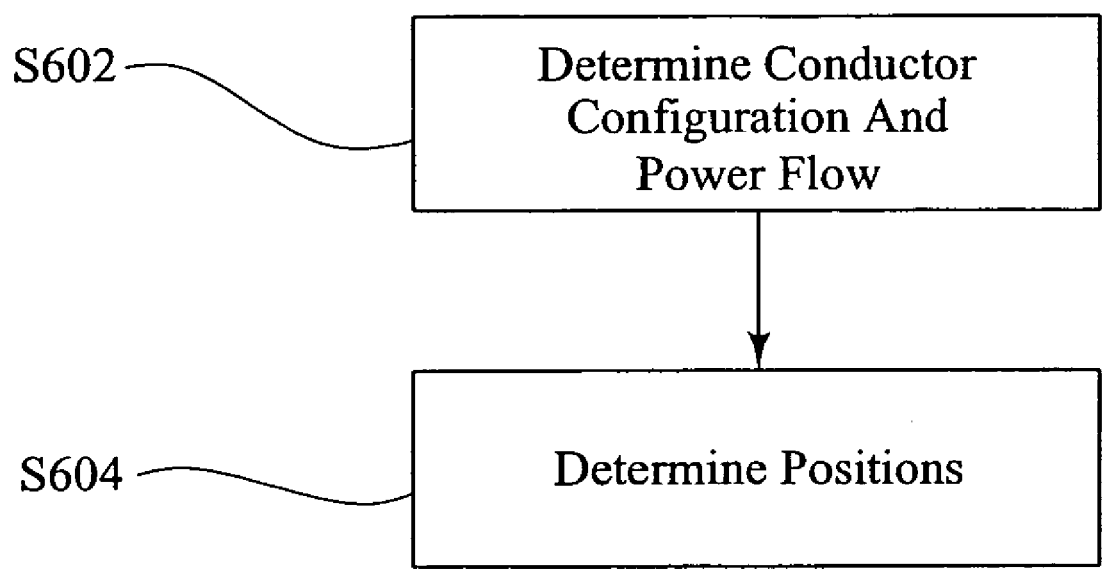
FIG. 6 is a logic flow diagram of a method for selecting a preferred placement of magnetic field monitors according to an embodiment of the invention.

As shown in FIG. 6, an exemplary method for selecting positions for a preferred placement for a plurality of magnetic field monitors for monitoring the power flowing through an electric power transmission line set includes the step of S602 determining a conductor configuration and power flow of the transmission line set at a location along the transmission line set. The possible magnetic fields in the planar area can be modeled using the conductor configuration of the transmission line set. The model data can then be compared to actual magnetic field data to determine an actual power flow of the line set. Preferably, this modeling and comparison is accomplished through a computational analysis performed on a digital computer. Then, the selection process continues by S604 determining positions in a substantially planar area that is transverse to the transmission line set at the location where a predetermined change in the power flow of the line set will result in a maximum change in the magnetic field at the positions. Preferably, this step is also accomplished through a computational analysis performed on a digital computer.

The predetermined change in power flow of the line set may be a desired level of accuracy, such as 10 MW or 5 percent. This predetermined change in power flow is referred to herein as the "power resolution". Thus, for a vertical parallel transmission line set having a power flow of 50 MW/200 MW, a monitoring system having a power resolution of 10 MW will detect a change resulting in a power flow of 60 MW/210 MW.

Figure 7:
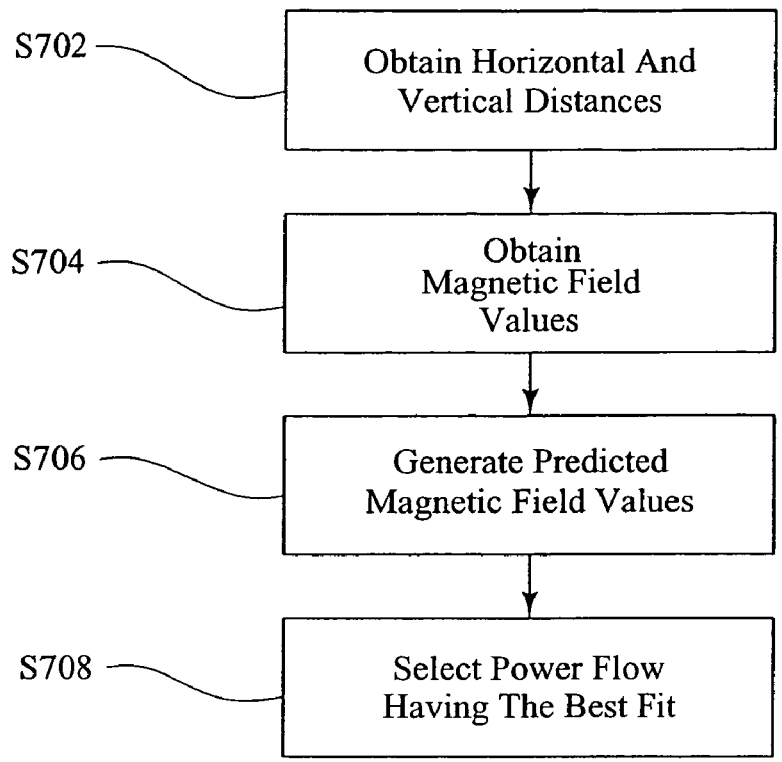
FIG. 7 is a logic flow diagram showing the steps of determining the conductor configuration and power flow in more detail.

As shown in FIG. 7, determining the conductor configuration and power flow of the transmission line set is accomplished through the steps of: S702 obtaining horizontal and vertical distances between each conductor and measuring points across the substantially planar area to determine the conductor configuration of the transmission line set in the planar area; S704 obtaining measured magnetic field values at said measuring points; S706 generating, through computation performed on a digital computer, predicted magnetic field values at each measuring point for a range of line set power flows; and S708 selecting the line set power flow where the predicted values have the best fit with the measured values.

Figure 8:
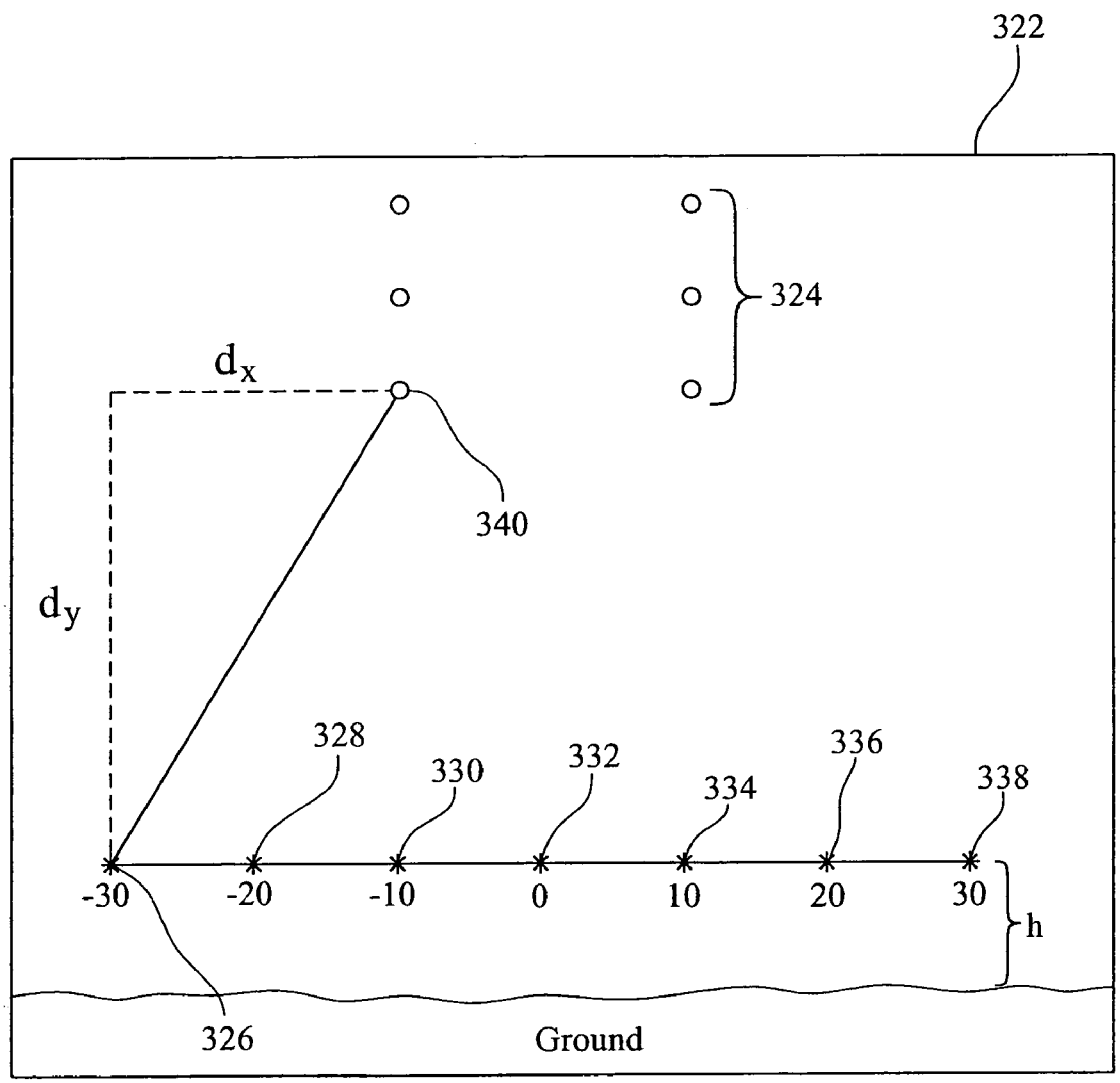
FIG. 8 is a view of a substantially planar area that is transverse to a transmission line set.

FIG. 8 shows an exemplary planar area 322 that is transverse to a vertical parallel transmission line set 324. A plurality of measuring points 326, 328, 330, 332, 334, 336, 338 are established under the transmission line set 324 and across the substantially planar area 322 at a height, h, above the ground. A preferred height above the ground is four feet (the height of a standard permanent monitor placement). Also, a preferred spacing between the measuring points is one meter, and the measuring points extend for 30 meters on either side of the center of the transmission line set 324. For convenience, the measuring points 326, 328, 330, 332, 334, 336, 338 of FIG. 8 are shown in intervals of 10 meters.

Using a commercially available distance measuring device (such as an Impulse 100, by Laser Technology, Inc. of Colorado), the horizontal distance and vertical distance between each measuring point and each conductor are collected. For instance, FIG. 8 shows a measuring point 326 located 30 meters from the center of the transmission line set 324, having a horizontal distance, $d_x$, and a vertical distance, $d_y$, between the measuring point 326 and the conductor 340. Of course, one of skill in the art will recognize that other means of obtaining the horizontal and vertical distances between each conductor and each conductor may be utilized within the scope of the invention described herein. The horizontal and vertical distances between all of the measuring points and all of the conductors establish specific geometric arrangement of each conductor in relation to the measuring points and to each other. This specific geometric arrangement is the conductor configuration.

Using a standard NIST (National Institute of Standards and Testing) calibrated gaussmeter (such as an Electromagnetic Field Radiation Tester, Model EMF-200A (range of 0.1 mG-199.9 mG), manufactured by A.W. Sperry Instruments Inc., of Hauppauge, N.Y.), magnetic field values are also collected at each measuring point. Preferably, horizontal and vertical vector components of the magnetic fields are collected at each measuring point, but any magnetic field vector components that are needed could be collected (horizontal or vertical to line set, or 3-axis in any frame of reference, such as relative to the surface of the earth, etc.). Measurement of the values may be repeated and averaged. Further, measurement of both the distances and the magnetic field values may be repeated under different ambient conditions to establish conductor configuration and magnetic field profiles for the various ambient conditions. Still further, one of skill in the art will recognize that other means of obtaining the measured magnetic field vector component values may be utilized without departing from the spirit of the scope of the claimed invention.

Using the conductor configuration and Biot-Savart modeling, predicted horizontal magnetic field values and predicted vertical magnetic field values are generated for a range of power flows of the transmission line set, or line set power flows. The individual conductors of a transmission line are assumed to carry the same current. The voltage of each transmission line is obtained by visual inspection cross-referenced with a power line mapping resource, as mentioned earlier. A power factor of 1.0 is assumed. A matrix of predicted magnetic field values is calculated using the conductor configuration for a range of power flows varied between zero and the maximum power rating of the transmission line set. The line set power flow having predicted values that are a best fit with the measured values is then selected as the actual line set power flow.

The best fit determination is made by summing the absolute value of the differences between each measured magnetic field value and the corresponding predicted magnetic field value to determine a total error for each line set power flow, and selecting the line set power flow with the least total error.

Figure 9:
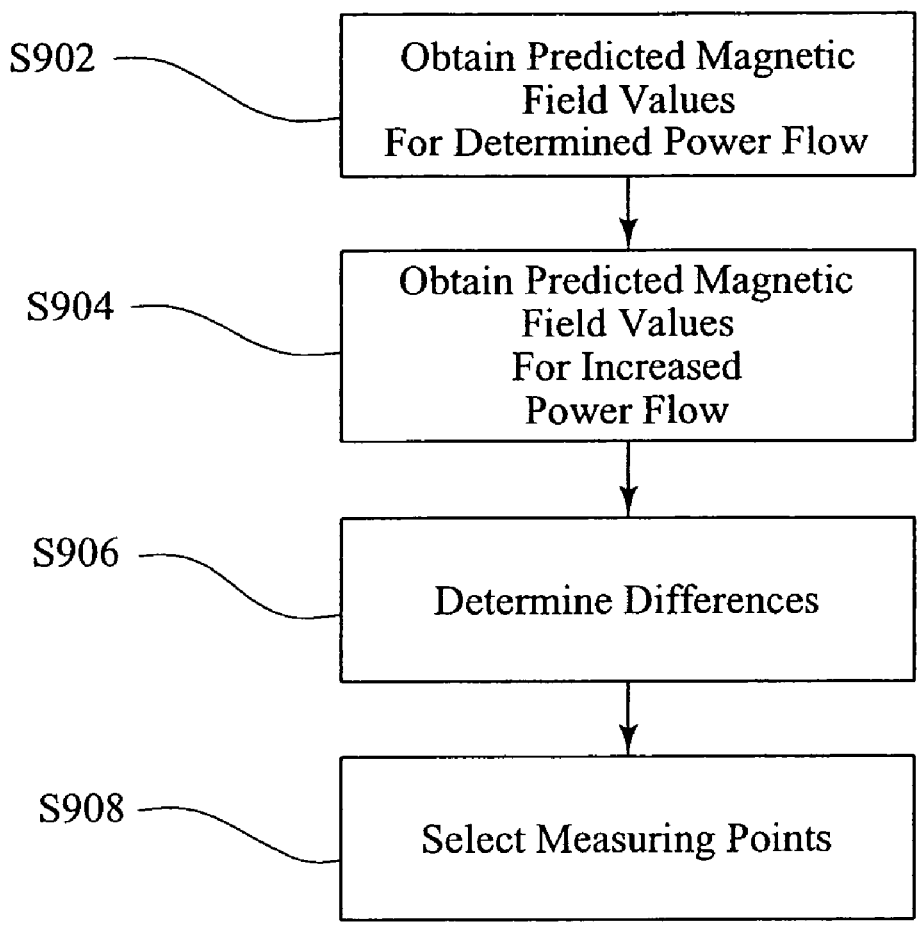
FIG. 9 is a logic flow diagram showing the steps of determining positions where a change in power flow through the line results in a maximum change in the magnetic field.

Then, as shown in FIG. 9, the preferred placement of monitors for power flow through the transmission line set is determined by: S902 obtaining predicted magnetic field values at each measuring point for the determined power flow of the transmission line set; S904 obtaining predicted magnetic field values at each measuring point for a power flow of the transmission line set where the determined power flow has changed by a predetermined power amount; S906 determining the differences between the predicted values for the changed power flow and the predicted values for the determined power flow for the magnetic field at each measuring point; and S908 selecting the measuring points having the maximum differences as the positions where a change in power flow through the line results in the maximum change in the magnetic field.

The predicted magnetic field values may have already been generated in calculating the matrix of predicted magnetic field values described above. The smallest increment of power change that one wishes to detect (i.e. the "power resolution") is selected as the predetermined power amount for the changed power flow. A preferred power resolution for a typical power flow monitoring system is 10 MW. The predicted horizontal and vertical magnetic field values for the changed power flow may also have already been generated in calculating the matrix of predicted magnetic field values described above. By determining the differences between the predicted values for the changed power flow and for the determined power flow, the measuring points having the maximum change in the magnetic field for the changed power flow are determined.

Figure 10:
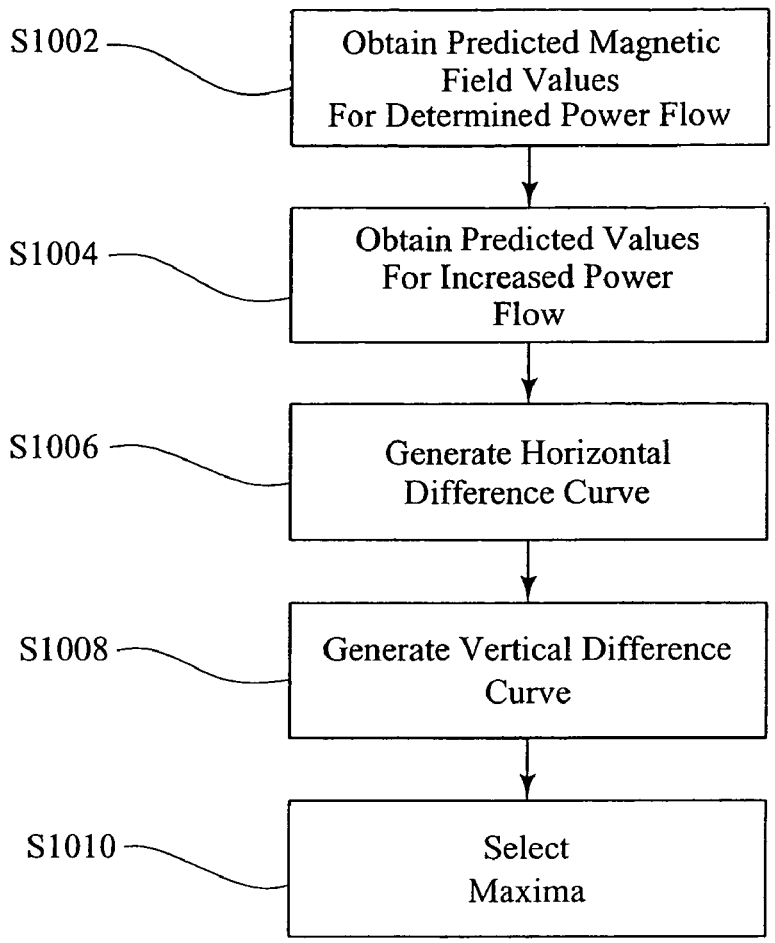
FIG. 10 is a logic flow diagram showing a graphical method for determining positions where a change in power flow through the line results in a maximum change in magnetic field.

As shown in FIG. 10, a graphical method for determining the preferred placement of monitors includes the steps of: S1002 obtaining predicted horizontal magnetic field values and predicted vertical magnetic field values at each measuring point for the determined power flow of the transmission line set; S1004 obtaining predicted horizontal magnetic field values and predicted vertical magnetic field values at each measuring point for a power flow of the transmission line set where the determined power flow has changed by a predetermined power amount; S1006 generating a horizontal magnetic field difference curve by taking the difference between the predicted horizontal magnetic field values for the changed power flow and the predicted horizontal magnetic field values for the determined power flow at each measuring point; S1008 generating a vertical magnetic field difference curve by taking the difference between the predicted vertical magnetic field values for the changed power flow and the predicted vertical magnetic field values for the determined power flow at each measuring point; and S1010 selecting the maxima of the horizontal magnetic field difference curve and the vertical magnetic field difference curve.

Figure 11:
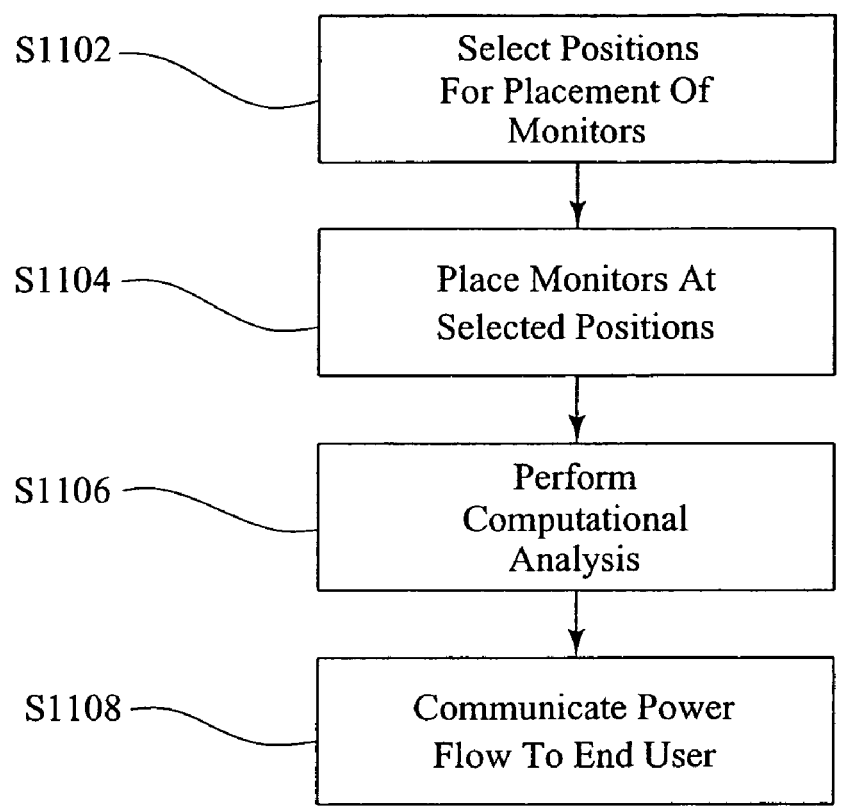
FIG. 11 is a logic flow diagram showing the steps of a method for monitoring power flowing through an electric power transmission line set, according to an embodiment of the invention.

Thus, as shown in FIG. 11, a method for monitoring power flow through an electric power transmission line set included the steps of: S1102 selecting positions for a preferred placement for a plurality of magnetic field monitors; S1104 placing magnetic field monitors at the selected positions for collecting magnetic field data; S1106 performing a computational analysis on the magnetic field data to determine a power flow through the transmission line set; and S1108 communicating said power flow to an end user.

Figure 12:
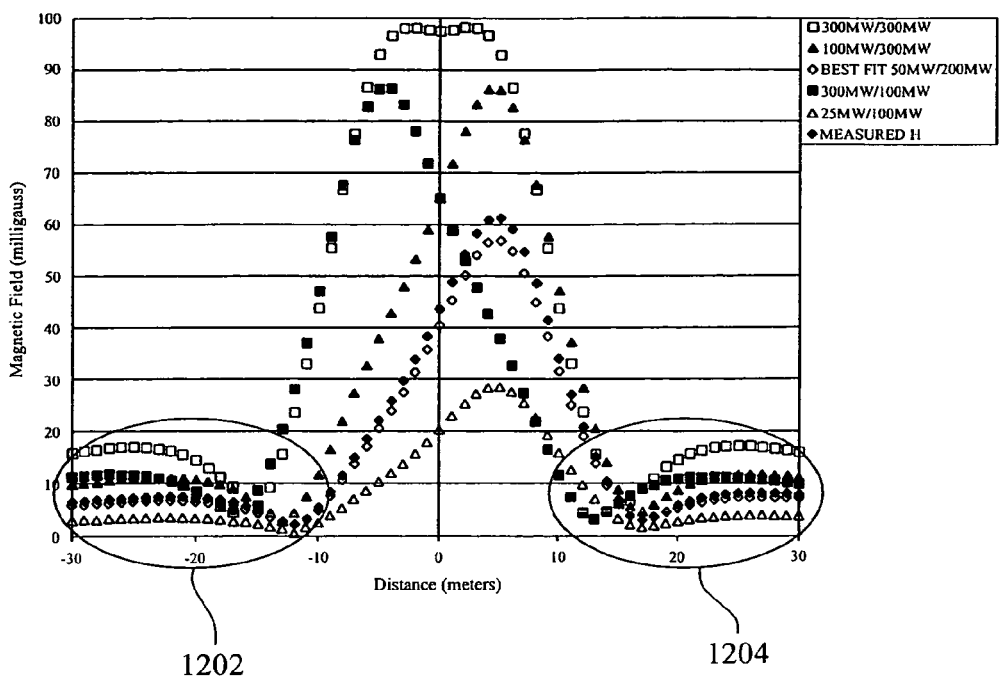
FIG. 12 shows the measured horizontal magnetic field values, and predicted horizontal magnetic field values for a range of line current configurations for a particular planar area transverse to a representative vertical parallel transmission line set.
Figure 13:
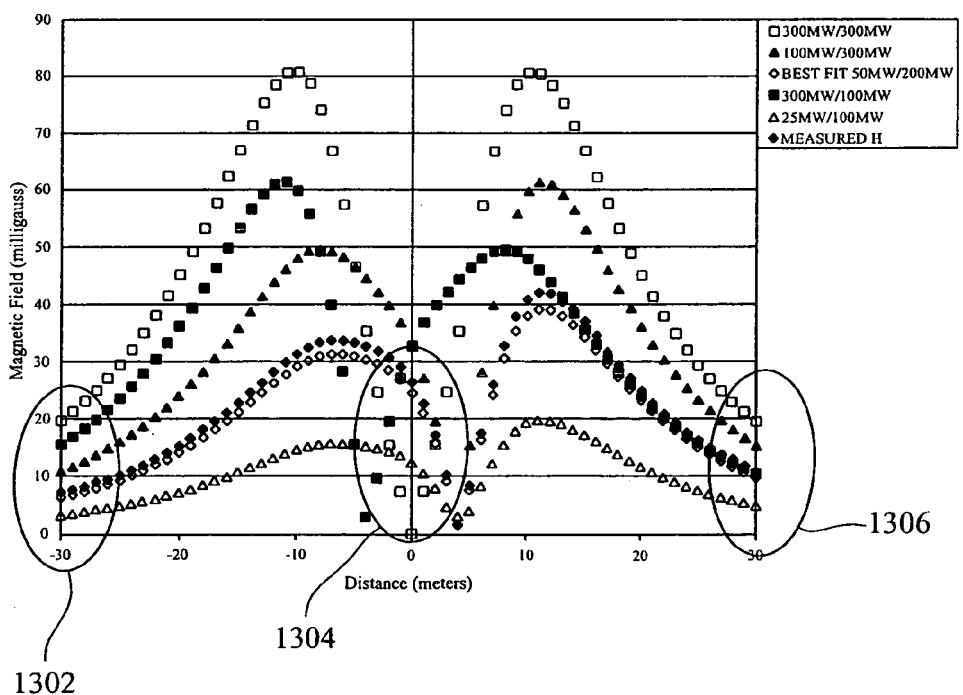
FIG. 13 shows the measured vertical magnetic field values, and predicted vertical magnetic field values for a range of line current configurations for the planar area of the transmission line set of FIG. 12.

Turning now to an example, FIG. 12 shows the measured horizontal magnetic field values, and predicted horizontal magnetic field values for a range of power flows for a particular planar area transverse to a representative vertical parallel transmission line set. FIG. 13 shows the measured vertical magnetic field values, and predicted vertical magnetic field values for a range of power flows for the transmission line set of FIG. 12. As shown graphically, the best fit of the predicted values to the measured values is a 50 MW/200 MW power flow, with 50 MW flowing through the left transmission line, and 200 MW flowing through the right transmission line. A best fit analysis could also be performed through computation performed on a digital computer. As shown, there are areas 1202, 1204, 1302, 1304, 1306 where large changes in power flow result in only minimal change in the shape and magnitude of the predicted horizontal and vertical magnetic field values. Such areas are non-optimal for placing monitors to measure changes in power flowing through the transmission line set.

Figure 14:
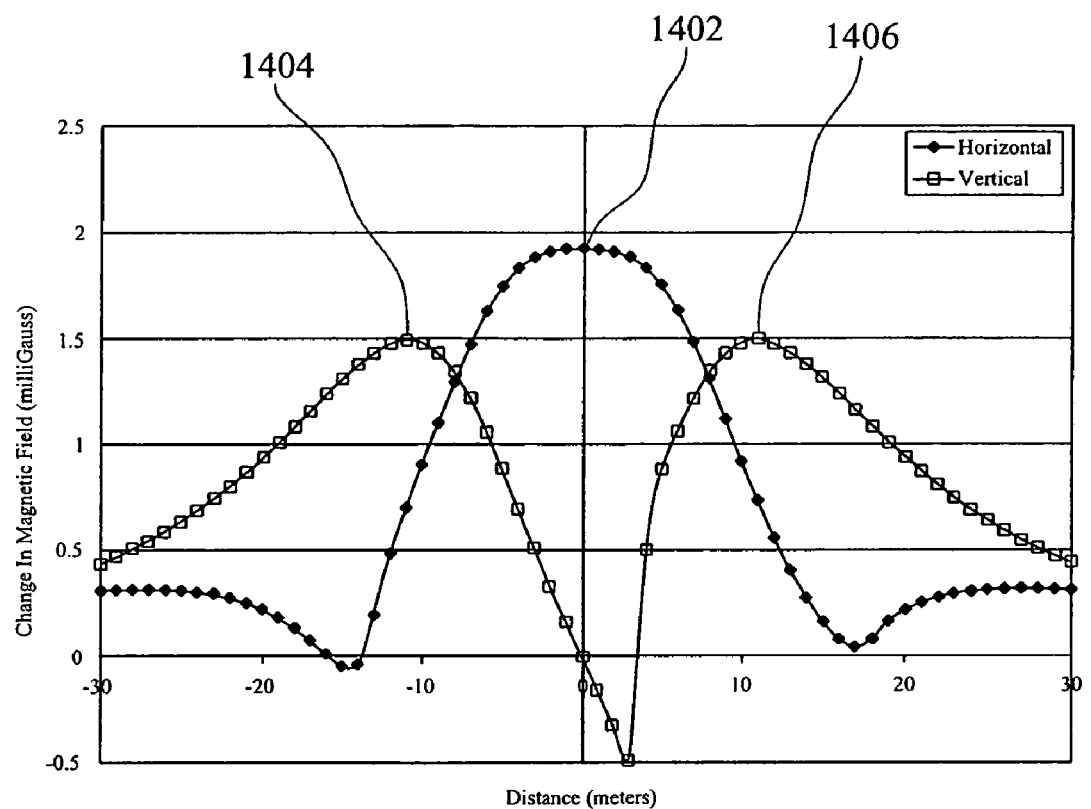
FIG. 14 shows a horizontal magnetic field difference curve and a vertical magnetic field difference curve for a determined power flow and a power flow that has changed by a predetermined amount.

Thus, it is desirable to determine positions where a predetermined change in power flow through the line will result in a maximum change in the magnetic field. Continuing with the determined power flow of 50 MW/200 MW of the example of FIGS. 12 and 13, FIG. 14 shows a horizontal magnetic field difference curve generated by taking the difference between the predicted horizontal magnetic field values for an increased power flow of 10 MW in each transmission line (i.e. a 60 MW/210 MW power flow) and the predicted horizontal magnetic field values for the determined power flow (i.e. 50 MW/200 MW). Also shown is a vertical magnetic field difference curve generated by taking the difference between the predicted vertical magnetic field values for the 10 MW increased power flow and the predicted vertical magnetic field values for the determined power flow. The horizontal magnetic field difference curve has maxima 1402 at the 0 meter position, and the vertical magnetic field difference curve has maxima 1404, 1406 at −11 meters and 11 meters. The preferred positions for placement of magnetic field monitors are, therefore, at the measuring points located at −11 meters, 0, and 11 meters.

As an observation, it is noted that the preferred minimum number of magnetic field monitors will correspond to the three maxima of the horizontal and vertical magnetic field difference curves. However, additional accuracy may be obtained with the addition of other magnetic field monitors positioned in the substantially planar area, but at the expense of the additional monitors.

In the above description of the present invention, it should be recognized that the method for selecting a preferred placement of magnetic field monitors may be found as executable instructions contained on a computer readable medium. Additionally, the steps of determining a conductor configuration and a power flow of the transmission line set, and determining positions where a predetermined change in power flow results in a maximum change in the magnetic field at the positions, are practically accomplished through a computational analysis performed on a digital computer.

One of ordinary skill in the art will recognize that additional configurations and steps are possible without departing from the teachings of the invention or the scope of the claims which follow. This detailed description, and particularly the specific details of the exemplary embodiments disclosed, is given primarily for clearness of understanding and no unnecessary limitations are to be understood therefrom, for modifications will become obvious to those skilled in the art upon reading this disclosure and may be made without departing from the spirit or scope of the claimed invention.

What is claimed is:

1. A method for monitoring the power flowing through an electric power transmission line set, comprising:

selecting positions for a preferred placement for a plurality of magnetic field monitors by (a) determining a conductor configuration a power flow of the transmission line set at a location along the transmission line set, and (b) determining positions in a substantially planar area that is transverse to said transmission line set at said location where a predetermined change in said power flow results in a maximum change in the magnetic field at the positions;

placing said magnetic field monitors at said selected positions for collecting magnetic field data;

performing a computational analysis on said magnetic field data to determine a power flow through said transmission line set; and communicating said power flow to an end user;

wherein said sub-step of determining the conductor configuration and power flow of the transmission line set includes:

obtaining horizontal and vertical distances between each conductor and a plurality of measuring points across the substantially planar area to determine the conductor configuration of the transmission line set;

obtaining measured magnetic field values at said measuring points;

generating, through computation performed on a digital computer, predicted magnetic field values and at each measuring point for a range of line set power flows; and selecting the line set power flow where the predicted values have a best fit with the measured values.

2. The method of claim 1, wherein the sub-step of selecting the line set power flow includes:

summing the absolute value of the differences between each measured magnetic field value and the corresponding predicted magnetic field value to determine a total error for each line set power flow; and selecting the line set power flow with the least total error as the best fit with the measured values.

3. The method of claim 1, wherein the sub-step of determining positions where a change in the power flow of the line set results in a maximum change in magnetic field at the positions includes:

obtaining predicted magnetic field values at each measuring point for the determined power flow of the transmission line set;

obtaining predicted magnetic field values at each measuring point for a power flow of the transmission line set where the determined power flow has changed by a predetermined amount;

determining the differences between the predicted values for the changed power flow and the predicted values for the determined power flow for the magnetic field at each measuring point; and selecting the measuring points having the maximum differences as the positions where a change in the power flow of the line set results in a maximum change in the magnetic field at the positions.

4. A method for monitoring the power flowing through an electric power transmission line set, comprising:

selecting positions for a preferred placement for a plurality of magnetic field monitors by (a) determining a conductor configuration and a power flow of the transmission line set at a location along the transmission line set, and (b) determining positions in a substantially planar area that is transverse to said transmission line set at said location where a predetermined change in said power flow results in a maximum change in the magnetic field at the positions;

placing said magnetic field monitors at said selected positions for collecting magnetic field data;

performing a computational analysis on said magnetic field data to determine a power flow through said transmission line set; and communicating said power flow to an end user, wherein said sub-step of determining positions where a change in power flow through the line results in a maximum change in magnetic field at the positions includes:

obtaining predicted horizontal magnetic field values and predicted vertical magnetic field values at each measuring point for the determined power flow of the transmission line;

obtaining predicted horizontal magnetic field values and predicted vertical magnetic field values at each measuring point for a power flow of the transmission line where the determined power flow has changed by a predetermined power amount;

generating a horizontal magnetic field difference curve by taking the difference between the predicted horizontal magnetic field values for the changed power flow and the predicted horizontal magnetic field values for the determined power flow at each measuring point;

generating a vertical magnetic field difference curve by taking the difference between the predicted vertical magnetic field values for the changed power flow and the predicted vertical magnetic field values for the determined power flow at each measuring point; and selecting the maxima of the horizontal magnetic field difference curve and the vertical magnetic field difference curve as the positions where a change in power flow through the line results in a maximum change in the magnetic field at the positions.

5. A system for monitoring the power flowing through an electric power transmission line set, said system comprising:

a plurality of magnetic field monitors placed at selected positions in a substantially planar area that is transverse to the transmission line set, said positions selected by:

determining a conductor configuration and a power flow of the transmission line set in the substantially planar area by: (a) obtaining horizontal and vertical distances between each conductor and a plurality of measuring points across the substantially planar area to determine the conductor configuration of the transmission line set; (b) obtaining measured magnetic field values at said measuring points; (c) generating, through computation performed on a digital computer, predicted magnetic field values at each measuring point for a range of line set power flows; and (d) selecting the line set power flow where the predicted values have a best fit with the measured values; and determining positions in the substantially planar area where a predetermined change in the power flow of the line set results in a maximum change in the magnetic field at the positions; and a central processing facility in communication with said plurality of magnetic field monitors for communicating the power flow determination to an end user.

6. The system of claim 5, wherein the positions in the substantially planar area where a change in power flow through the line results in a maximum change in magnetic field at the positions are determined by:

obtaining predicted magnetic field values at each measuring point for the determined power flow of the transmission line set;

obtaining predicted magnetic field values at each measuring point for a power flow of the transmission line set where the determined power flow has changed by a predetermined amount;

determining the differences between the predicted values for the changed power flow and the predicted values for the determined power flow at each measuring point; and selecting the measuring points having the maximum differences as the positions where a change in the power flow of the line set results in a maximum change in the magnetic field at the positions.

7. The system of claim 5, wherein the positions in the substantially planar area where a change in power flow through the line results in a maximum change in magnetic field at the positions are determined by:
   obtaining predicted horizontal magnetic field values and predicted vertical magnetic field values at each measuring point for the determined power flow of the transmission line set;
   obtaining predicted horizontal magnetic field values and predicted vertical magnetic field values at each measuring point for a power flow of the transmission line set where the determined power flow has changed by a predetermined power amount;
   generating a horizontal magnetic field difference curve by taking the difference between the predicted horizontal magnetic field values for the changed power flow and the predicted horizontal magnetic field values for the determined power flow at each measuring point;
   generating a vertical magnetic field difference curve by taking the difference between the predicted vertical magnetic field values for the changed power flow and the predicted vertical magnetic field values for the determined power flow at each measuring point;
   selecting the maxima of the horizontal magnetic field difference curve and the vertical magnetic field difference curve as the positions where a change in power flow through the line results in a maximum change in the magnetic field at the positions.

8. A method for selecting positions for a preferred placement for a plurality of magnetic field monitors for monitoring the power flowing through an electric power transmission line set, said method comprising:
   determining, through a computational analysis performed on a digital computer, a conductor configuration and a power flow of the transmission line set at a location along the transmission line set by:
      obtaining horizontal and vertical distances between each conductor and a plurality of measuring points across the substantially planar area;
      obtaining magnetic field values at said measuring points;
      generating, through computation performed on a digital computer, predicted magnetic field values at each measuring point for a range of line set power flows; and
      selecting the line set power flow where the predicted values have a best fit with the obtained values; and
   determining, through a computational analysis performed on a digital computer, positions in a substantially planar area that is transverse to the transmission line set at the location where a predetermined change in the power flow of the line set results in a maximum change in the magnetic field at the positions, thereby indicating the preferred placement of the monitors.

9. The method of claim 8, wherein the sub-step of selecting the line set power flow includes:
   summing the absolute value of the differences between each measured magnetic field value and the corresponding predicted magnetic field value to determine a total error for each line set power flow; and
   selecting the line set power flow with the least total error as the best fit with the measured values.

10. The method of claim 8, wherein said step of determining positions where a change in the power flow of the line set results in a maximum change in the magnetic field at the positions includes:
   obtaining predicted magnetic field values at each measuring point for the determined power flow of the transmission line set;
   obtaining predicted magnetic field values at each measuring point for a power flow of the transmission line set where the determined power flow has changed by a predetermined amount;
   determining the differences between the predicted values for the changed power flow and the predicted values for the determined power flow for the magnetic field at each measuring point; and
   selecting the measuring points having the maximum differences as the positions where a change in the power flow of the line set results in a maximum change in the magnetic field at the positions.

11. The method of claim 8, wherein said step of determining positions where a change in power flow through the line results in a maximum change in magnetic field at the positions includes:
   obtaining predicted horizontal magnetic field values and predicted vertical magnetic field values at each measuring point for the determined power flow of the transmission line set;
   obtaining predicted horizontal magnetic field values and predicted vertical magnetic field values at each measuring point for a power flow of the transmission line set where the determined power flow has changed by a predetermined power amount;
   generating a horizontal magnetic field difference curve by taking the difference between the predicted horizontal magnetic field values for the changed power flow and the predicted horizontal magnetic field values for the determined power flow at each measuring point;
   generating a vertical magnetic field difference curve by taking the difference between the predicted vertical magnetic field values for the changed power flow and the predicted vertical magnetic field values for the determined power flow at each measuring point; and
   selecting the maxima of the horizontal magnetic field difference curve and the vertical magnetic field difference curve as positions for a preferred placement for a plurality of magnetic field monitors for monitoring the power flow through a transmission line set.

12. A computer readable medium having computer executable instructions for performing a method for selecting positions for a preferred placement for a plurality of magnetic field monitors for monitoring power flow through an electric power transmission line set, said method comprising:
   determining a conductor configuration and a power flow of the transmission line set at a location along the transmission line set by
      obtaining horizontal and vertical distances between each conductor and a plurality of measuring points across the substantially planar area to determine the detailed conductor configuration of the transmission line set at the location along the line;
      obtaining magnetic field values at said measuring points; generating predicted magnetic field values at each measuring point for a range of line set power flows; and
      selecting the line set power flow where the predicted values have a best fit with the measured values; and determining positions in a substantially planar area that is transverse to the transmission line set at the location where a predetermined change in the power flow through the line set results in a maximum change in the magnetic field at the positions, thereby indicating the preferred placement of the monitors.

13. The computer readable medium of claim 12, wherein the computer executable instructions for performing said step of determining positions where a change in the power flow of the line set results in a maximum change in the magnetic field at the positions includes:
   obtaining predicted magnetic field values at each measuring point for the determined power flow of the transmission line set;
   obtaining predicted magnetic field values at each measuring point for a power flow of the transmission line set where the determined power flow has changed by a predetermined power amount;
   determining the differences between the predicted values for the changed power flow and the predicted values for the determined power flow for the horizontal magnetic field values and the vertical magnetic field values at each measuring point; and
   selecting the measuring points having the maximum differences as the positions where a change in the power flow of the line set results in a maximum change in the magnetic field at the positions.

14. The computer readable medium of claim 12, wherein the computer executable instructions for performing said step of determining positions where a change in the power flow of the line set results in a maximum change in magnetic field at the positions includes:
   obtaining predicted horizontal magnetic field values and predicted vertical magnetic field values at each measuring point for the determined power flow of the transmission line set;
   obtaining predicted horizontal magnetic field values and predicted vertical magnetic field values at each measuring point for a power flow of the transmission line set where the determined power flow has changed by a predetermined power amount;
   generating a horizontal magnetic field difference curve by taking the difference between the predicted horizontal magnetic field values for the changed power flow and the predicted horizontal magnetic field values for the determined power flow at each measuring point;
   generating a vertical magnetic field difference curve by taking the difference between the predicted vertical magnetic field values for the changed power flow and the predicted vertical magnetic field values for the determined power flow at each measuring point; and
   selecting the maxima of the horizontal magnetic field difference curve and the vertical magnetic field difference curve as the preferred placement for magnetic field monitors for measuring power flow through an electric power transmission line set.

* * * * *